US008976580B2

(12) United States Patent
Lee et al.

(10) Patent No.: US 8,976,580 B2
(45) Date of Patent: Mar. 10, 2015

(54) MEMORY SYSTEM AND RELATED METHOD OF OPERATION

(71) Applicant: Samsung Electronics Co., Ltd., Suwon-si, Gyeonggi-Do (KR)

(72) Inventors: Chul-Ho Lee, Suwon-si (KR); Seijin Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 134 days.

(21) Appl. No.: 13/783,850

(22) Filed: Mar. 4, 2013

(65) Prior Publication Data

US 2013/0279246 A1    Oct. 24, 2013

(30) Foreign Application Priority Data

Apr. 18, 2012    (KR) .................. 10-2012-0040499

(51) Int. Cl.
*G11C 11/00*    (2006.01)
*G11C 11/34*    (2006.01)
*G11C 13/00*    (2006.01)
*G11C 16/20*    (2006.01)
*G11C 11/16*    (2006.01)

(52) U.S. Cl.
CPC ............ *G11C 13/0004* (2013.01); *G11C 16/20* (2013.01); *G11C 11/16* (2013.01); *G11C 2213/79* (2013.01)
USPC ................. 365/163; 365/185.17; 365/185.29; 365/185.33

(58) Field of Classification Search
USPC .................... 365/163, 185.17, 185.29, 185.33
See application file for complete search history.

(56) References Cited

U.S. PATENT DOCUMENTS

| 7,353,324 | B2 | 4/2008 | Tanaka |
| 7,475,185 | B2 | 1/2009 | Nakanishi et al. |
| 7,787,297 | B2 | 8/2010 | Jeon et al. |
| 7,898,859 | B2 | 3/2011 | Ghodsi |
| 7,916,538 | B2 | 3/2011 | Jeon et al. |
| 7,986,551 | B2 * | 7/2011 | Park et al. ................... 365/163 |
| 8,134,866 | B2 * | 3/2012 | Bae et al. ..................... 365/163 |
| 8,139,432 | B2 * | 3/2012 | Choi et al. .................... 365/163 |
| 8,143,653 | B2 * | 3/2012 | Cho et al. ..................... 365/163 |
| 8,243,542 | B2 * | 8/2012 | Bae et al. ..................... 365/163 |
| 8,279,664 | B2 * | 10/2012 | Chang et al. .................. 365/163 |
| 8,432,736 | B2 * | 4/2013 | Kim et al. ................. 365/185.17 |
| 8,456,940 | B2 * | 6/2013 | Hanzawa et al. ............. 365/163 |
| 8,526,258 | B2 * | 9/2013 | Kim et al. ..................... 365/163 |
| 2010/0030953 | A1 | 2/2010 | Noh et al. |
| 2010/0037001 | A1 | 2/2010 | Langlois et al. |
| 2010/0037005 | A1 | 2/2010 | Kim et al. |
| 2010/0088467 | A1 | 4/2010 | Lee et al. |
| 2011/0119561 | A1 | 5/2011 | Lee et al. |
| 2011/0145477 | A1 | 6/2011 | Rudelic |

* cited by examiner

*Primary Examiner* — Trong Phan
(74) *Attorney, Agent, or Firm* — Volentine & Whitt, PLLC

(57) ABSTRACT

A memory system comprises a nonvolatile memory and a phase change memory. The memory system can be operated by reading operation information of the nonvolatile memory from the phase change memory, adjusting voltage parameters of the nonvolatile memory based on the read operation information, and performing an operation of the nonvolatile memory based on the adjusted voltage parameters.

20 Claims, 16 Drawing Sheets

MEMORY SYSTEM AND RELATED METHOD OF OPERATION

CROSS-REFERENCE TO RELATED APPLICATIONS

This application claims priority under 35 U.S.C. §119 to Korean Patent Application No. 10-2012-0040499 filed Apr. 18, 2012, the subject matter of which is hereby incorporated by reference.

BACKGROUND OF THE INVENTION

The inventive concept relates generally to electronic memory technologies. More particularly, certain embodiments of the inventive concept relate to a memory system and methods of operating the memory system.

Semiconductor memory devices form an important component of most modern electronic devices. For example, they can be found in most computing and mobile electronic devices. A semiconductor memory device is typically fabricated using a semiconductor material such as silicon (Si), germanium (Ge), gallium arsenide (GaAs), or indium phosphide (InP), for example.

Semiconductor memory devices can be roughly divided into two categories according to whether they retain stored data when disconnected from power. These categories include volatile memory devices and nonvolatile memory devices. Examples of volatile memory devices include static RAM (SRAM), dynamic RAM (DRAM), and synchronous DRAM (SDRAM). Examples of nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM).

In recent years there has been a continuing increase in demand for nonvolatile memory devices to provide data storage for mobile electronic devices such as smart phones, tablet computers, and laptops, as well as other types of electronic devices. In conjunction with this increasing demand, there has also been a demand for memory devices having improved performance. Accordingly, in an effort to meet this demand, researchers are engaged in continuing efforts to improve the above and other forms of nonvolatile memory devices.

SUMMARY OF THE INVENTION

In one embodiment of the inventive concept, a method is provided for operating a memory system comprising a nonvolatile memory and a phase change memory. The method comprises reading operation information of the nonvolatile memory from the phase change memory, adjusting voltage parameters of the nonvolatile memory based on the read operation information, and performing an operation of the nonvolatile memory based on the adjusted voltage parameters.

In another embodiment of the inventive concept, a memory system comprises a nonvolatile memory, a phase change memory configured to store operation information of the nonvolatile memory, and a controller configured to adjust voltage parameters using the operation information stored in the phase change memory and to control the nonvolatile memory to perform a program, read, or erase operation according to the adjusted voltage parameters.

In another embodiment of the inventive concept, a memory system comprises a controller configured to read operation information for a nonvolatile memory from a phase change memory, to adjust voltage parameters of the nonvolatile memory based on the read operation information, and control an operation of the nonvolatile memory based on the adjusted voltage parameters.

These and other embodiments of the inventive concept can potentially improve the performance and reliability of a memory system by changing operating parameters according to varying operating conditions.

BRIEF DESCRIPTION OF THE DRAWINGS

The drawings illustrate selected embodiments of the inventive concept. In the drawings, like reference numbers indicate like features.

DETAILED DESCRIPTION

Figure 1:
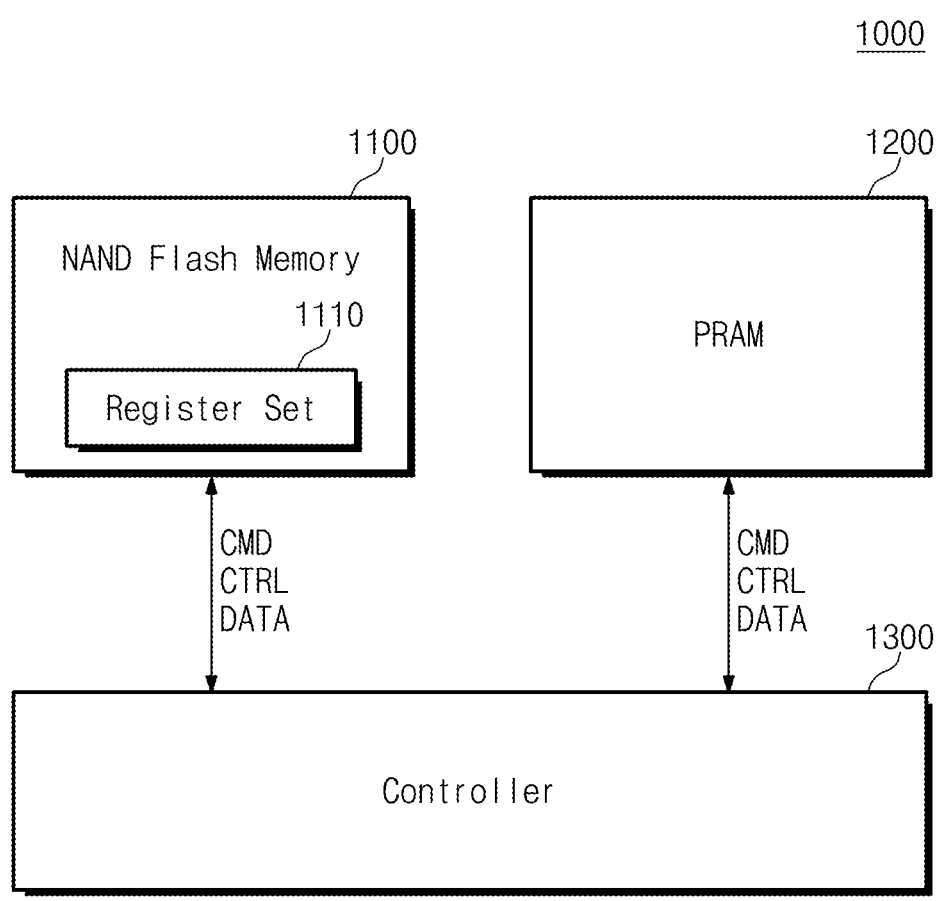
FIG. 1 is a block diagram illustrating a memory system according to an embodiment of the inventive concept.

Embodiments of the inventive concept are described below with reference to the accompanying drawings. These embodiments are provided as teaching examples and should not be construed to limit the scope of the inventive concept.

In the description that follows, the terms "first", "second", "third", etc., may be used to describe various elements, components, regions, layers and/or sections, but the described elements, components, regions, layers and/or sections should not be limited by these terms. Rather, these terms are used merely to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if a device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, where a layer is referred to as being "between" two layers, it can be the only layer between the two layers, or one or more intervening layers may also be present.

The terminology used herein is for the purpose of describing particular embodiments only and is not intended to limit the inventive concept. As used herein, the singular forms "a", "an" and "the" are intended to include the plural forms as well, unless the context clearly indicates otherwise. The terms "comprises" and/or "comprising," where used in this specification, indicate the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Where an element or layer is referred to as being "on", "connected to", "coupled to", or "adjacent to" another element or layer, it can be directly on, connected, coupled, or adjacent to the other element or layer, or intervening elements or layers may be present. In contrast, where an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

FIG. 1 is a block diagram illustrating a memory system 1000 according to an embodiment of the inventive concept.

Referring to FIG. 1, memory system 1000 comprises a NAND flash memory 1100, a phase change memory 1200, and a controller 1300. NAND flash memory 1100 may be used as main storage of memory system 1000. NAND flash memory 1100 comprises a plurality of cell strings each comprising a plurality of memory cells connected in series. NAND flash memory 1100 performs program, read, and erase operations under the control of controller 1300. NAND flash memory 1100 receives a command CMD and control signals CTRL, and exchange data with controller 1300.

NAND flash memory 1100 comprises a register set 1110. Register set 1110 comprises a plurality of registers. Values in the registers of register set 1110 are controlled by controller 1300. Values in the registers of register set 1110 comprise voltage parameters, and NAND flash memory 1100 adjusts operating voltages based on the voltage parameters. For example, NAND flash memory 1100 may control levels or application times of various voltages which are used at programming, reading, or erasing.

Phase change memory 1200 can be used as main storage, auxiliary storage, buffer memory, or a cache memory of memory system 1000. Phase change memory 1200 comprises a plurality of memory cells. Phase change memory 1200 performs program, read, and erase operations according to the control of controller 1300. Phase change memory 1200 receives a command CMD and control signals CTRL, and exchanges data with controller 1300.

Phase change memory 1200 stores operation information associated with NAND flash memory device 1100. Controller 1300 controls NAND flash memory 1100 and phase change memory 1200. Controller 1300 controls NAND flash memory 1100 to adjust voltage parameters based on operation information stored in phase change memory 1200.

Although memory system 1000 is described as including NAND flash memory 1100, in alternative embodiments, NAND flash memory 1100 could be replaced with another type of nonvolatile memory, such as a ROM, PROM, EPROM, EEPROM, flash memory, PRAM, MRAM, ReRAM, or an FRAM. Additionally, although memory system 1000 is described as including phase change memory 1200, in alternative embodiments phase change memory 1200 could be replaced with another type of nonvolatile memory such as ROM, PROM, EPROM, EEPROM, flash memory, PRAM, MRAM, ReRAM, or FRAM. Phase change memory 1200 may be a phase change RAM (PRAM) including memory cells each having a crystal state or an amorphous state or a magnetic RAM (MRAM) including memory cells having a parallel state or an antiparallel state.

Figure 2:
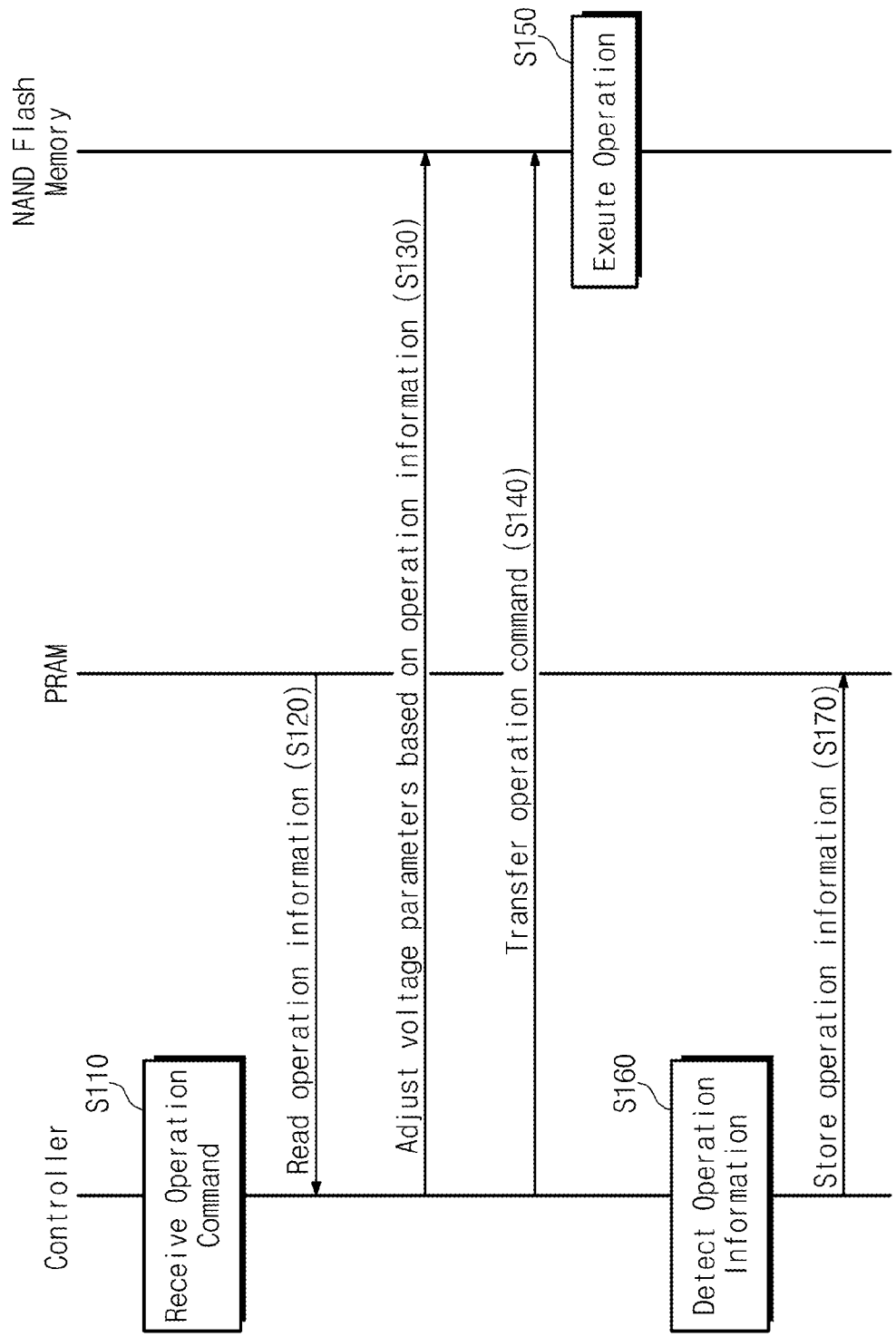
FIG. 2 is a flowchart illustrating a method of operating a memory system according to an embodiment of the inventive concept.

FIG. 2 is a flowchart illustrating a method of operating a memory system according to an embodiment of the inventive concept. For convenience, the method of FIG. 2 will be described with reference to memory system 1000 of FIG. 1.

Referring to FIGS. 1 and 2, in operation S110, controller 1300 receives an operation command from an external host. Controller 1300 typically generates the operation command according to a schedule or as a background operation. The operation command may be a program, read, or erase command, for example.

In operation S120, controller 1300 reads operation information of NAND flash memory 1100 stored in phase change memory 1200. Controller 1300 outputs a read command to phase change memory 1200 and receives the operation information from phase change memory 1200.

In operation S130, controller 1300 adjusts voltage parameters of NAND flash memory 1100 based on the read operation information. For example, controller 1300 may adjust voltage parameters of NAND flash memory 1100 by adjusting values in a register set 1110 of NAND flash memory 1100.

In operation S140, controller 1300 sends an operation command to NAND flash memory 1100. For example, controller 1300 may send a program, read, or erase command to NAND flash memory 1100.

In response to the transferred command, in operation S150, NAND flash memory 1100 performs an operation. NAND flash memory 1100 performs a read, program, or erase operation using voltages with levels or application times are adjusted in operation S130.

In operation S160, controller 1300 detects the operation information. Operation information of NAND flash memory 1100 may be changed due to programming, reading, or erasing of NAND flash memory 1100 executed in operation S150. In operation S170, controller 1300 detects the changed operation information to store it at phase change memory 1200 (or, to update phase change memory 1200 with the changed operation information).

The following Table 1 shows operation information and information stored in phase change memory 1200 according to the operation information.

TABLE 1

| Operation information | Stored information |
|---|---|
| Read number after programming (NR) | Read number after programming |
| Time after programming (TP) | Program time |
| Program and erase cycle (PE) | Program and erase cycle (PE) |
| Temperature after programming (TE) | Temperature at programming or difference between temperature at programming and reference temperature |

Referring to FIGS. 1 and 2 and Table 1, a read number after programming NR may be used as operation information. For example, the number of read operations executed after specific memory cells of NAND flash memory 1100 (e.g., memory cells connected to a word line) are programmed may be used as the operation information. The read number after programming NR may start to be counted after specific memory cells are programmed, be increased whenever a read operation is performed, and be reset when an erase operation is executed. As the read number after programming NR is used as the operation information, it may be stored in phase change memory 1200. For example, the read number after programming NR associated with each memory block, each page, or each sector of NAND flash memory 1100 may be stored in phase change memory 1200.

The time after programming TP may be used as the operation information. For example, a time elapsing after specific memory cells of NAND flash memory 1100, for example, memory cells connected to a word line are programmed may be used as the operation information. The time after programming TP is used as the operation information, a time may be stored in phase change memory 1200 when specific memory cells of NAND flash memory 1100 are programmed. When specific memory cells of NAND flash memory 1100 are programmed and a next operation is performed, a difference between a program time stored in phase change memory 1200 and a time when the next operation is performed may be detected as time TP. For example, time TP after a program operation is executed by a memory block unit, a page unit, or a sector unit of NAND flash memory 1100 may be stored in phase change memory 1200.

The program and erase cycle PE may be used as the operation information. For example, the number of program and erase operations executed with respect to specific memory cells of NAND flash memory 1100, for example, memory cells connected to a word line may be used as the operation information. As the program and erase cycle PE is used as the operation information, it may be stored in phase change memory 1200. For example, the program and erase cycle PE associated with each memory block, each page, or each sector of NAND flash memory 1100 may be stored in phase change memory 1200.

The temperature after programming TE may be used as the operation information. For example, a variation in temperature after specific memory cells of NAND flash memory 1100 are programmed (e.g., memory cells connected to a particular word line) may be used as the operation information. Where the temperature after programming TE is used as the operation information, a temperature at programming or a difference between a temperature at programming and a reference temperature may be stored in phase change memory 1200. If the temperature at programming is stored in phase change memory 1200, the temperature after programming TE may be detected according to a difference between a temperature where a next operation is executed and a temperature stored in phase change memory 1200. Where a difference between a temperature at programming and a reference temperature is stored in phase change memory 1200, the temperature after programming TE may be detected according to a difference between a temperature when a next operation is executed and a reference temperature and a difference stored in phase change memory 1200.

The following Table 2 shows an example where voltage parameters are adjusted according to operation information.

TABLE 2

| Voltage parameters | Adjustment |
|---|---|
| Read voltage level | Increase when NR increases<br>Decrease when TP decreases<br>Increase in increment/decrement when PE increases<br>Increase when TE increases<br>Decrease when TE decreases |
| Application time of read voltage | Increase when NR increases<br>Decrease when TP increases<br>Increase in increment/decrement when PE increases<br>Increase when TE increases<br>Decrease when TE decreases |

In some embodiments, read voltage parameters are adjusted as illustrated in Table 2. Read voltage parameters may indicate a read voltage to be applied to a selected word line or an unselected word line.

Referring to FIGS. 1 and 2 and Table 2, a level and an application time of a read voltage may be adjusted according to the operation information. If a read number NR of the operation information increases, a read voltage level may increase. When a read operation is executed, a threshold voltage distribution of memory cells may increase due to read voltages applied to unselected word lines. If a read voltage level increases according to an increase in a read number NR, a read operation may be performed with greater accuracy. Also, it is possible to prevent erroneous data from being read out when a read operation is not carried out normally.

If read number NR of the operation information increases, a read voltage application time may increase. When a read operation is executed, a threshold voltage distribution of memory cells may increase due to read voltages applied to unselected word lines. This may reduce a cell current, which can cause a read error. If a read voltage application time increases according to an increase in a read number NR, reduction of a cell current may be compensated, and a read operation may be performed with greater accuracy. Also, it is possible to prevent erroneous data from being read out when a read operation is not carried out normally.

If a time after programming TP of the operation information increases, a read voltage level may decrease. As a time after programming TP increases, charges may be leaked out from programmed memory cells. In this case, a threshold voltage distribution of memory cells may be shifted into a voltage decreasing direction. Where a read voltage level decreases according to an increase in a time after programming TP, a read operation may be performed with greater accuracy. Also, it is possible to prevent erroneous data from being read out when a read operation is not carried out normally.

If a time after programming TP of the operation information increases, a read voltage application time may decrease. As a time after programming TP increases, charges may be leaked out from programmed memory cells. In this case, a threshold voltage distribution of memory cells may be shifted into a voltage decreasing direction. When a threshold voltage distribution of memory cells is shifted in the voltage decreasing direction, a cell current may increase. An increase in a cell current may cause a read error. If a read voltage application time decreases according to an increase in a time after programming TP, reduction of a cell current may be compensated, and a read operation may be performed with greater accuracy. Also, it is possible to prevent a read operation to be performed when a read operation is not carried out normally.

When a program and erase cycle PE of the operation information increases, an increment/decrement of a read voltage level may become large. An increase in the program and erase cycle PE may cause deterioration of memory cells, so that charges accumulated or trapped at the memory cells leak out more readily. Also, a threshold voltage distribution of memory cells may be shifted in a voltage increasing direction due to read disturbance. In the event that an increment/decrement of a read voltage level becomes large according to an increase in a program and erase cycle PE, a read operation may be performed with greater accuracy. Also, it is possible to prevent a read operation to be performed when a read operation is not carried out normally.

If a program and erase cycle PE of the operation information increases, an increment/decrement of a read voltage application time may become large. An increase in the program and erase cycle PE may cause deterioration of memory cells, so that charges accumulated or trapped at the memory cells leak out more readily. Also, a threshold voltage distribution of memory cells may be shifted in a voltage increasing direction due to read disturbance. If an increment/decrement of a read voltage application time becomes large according to an increase in a program and erase cycle PE, a read operation may be performed with greater accuracy. Also, it is possible to prevent a read operation to be performed when a read operation is not carried out normally.

If a temperature after programming TP of the operation information increases, a read voltage level may increase. If a temperature after programming TP of the operation information decreases, a read voltage level may decrease. A specific threshold voltage may be formed when memory cells are programmed. If a temperature when a read operation is performed is higher than that when a program operation is carried out, a threshold voltage distribution may appear as if it is shifted in a voltage increasing direction. If a temperature when a read operation is performed is lower than that when a program operation is carried out, a threshold voltage distribution may appear as if it is shifted into a voltage decreasing direction. In the event that a read voltage level is adjusted according to a temperature after programming TP, a read operation may be performed with greater accuracy. Also, it is possible to prevent erroneous data from being read out when a read operation is not carried out normally.

Similarly, an increase or decrease in a threshold voltage distribution may cause an increase or decrease of a cell current. When a read voltage application time is adjusted according to a temperature after programming TP, a read operation may be performed with greater accuracy. Also, it is possible to prevent erroneous data from being read out when a read operation is not carried out normally.

Examples of adjusting read voltage parameters are described with reference to Tables 1 and 2. However, parameters of voltages used at programming or erasing may be also adjusted according to operation information stored in a phase change memory 1200. For example, a program voltage level, a program voltage application time, an increment of a program voltage, an erase voltage level, an erase voltage application time, or an increment of an erase voltage can be adjusted according to a program and erase cycle PE. If a program and erase cycle PE increases, a program voltage level, a program voltage application time, or an increment of a program voltage may decrease or increase. If a program and erase cycle PE increases, an erase voltage level, an erase voltage application time, or an increment of an erase voltage may decrease or increase.

Figure 3:
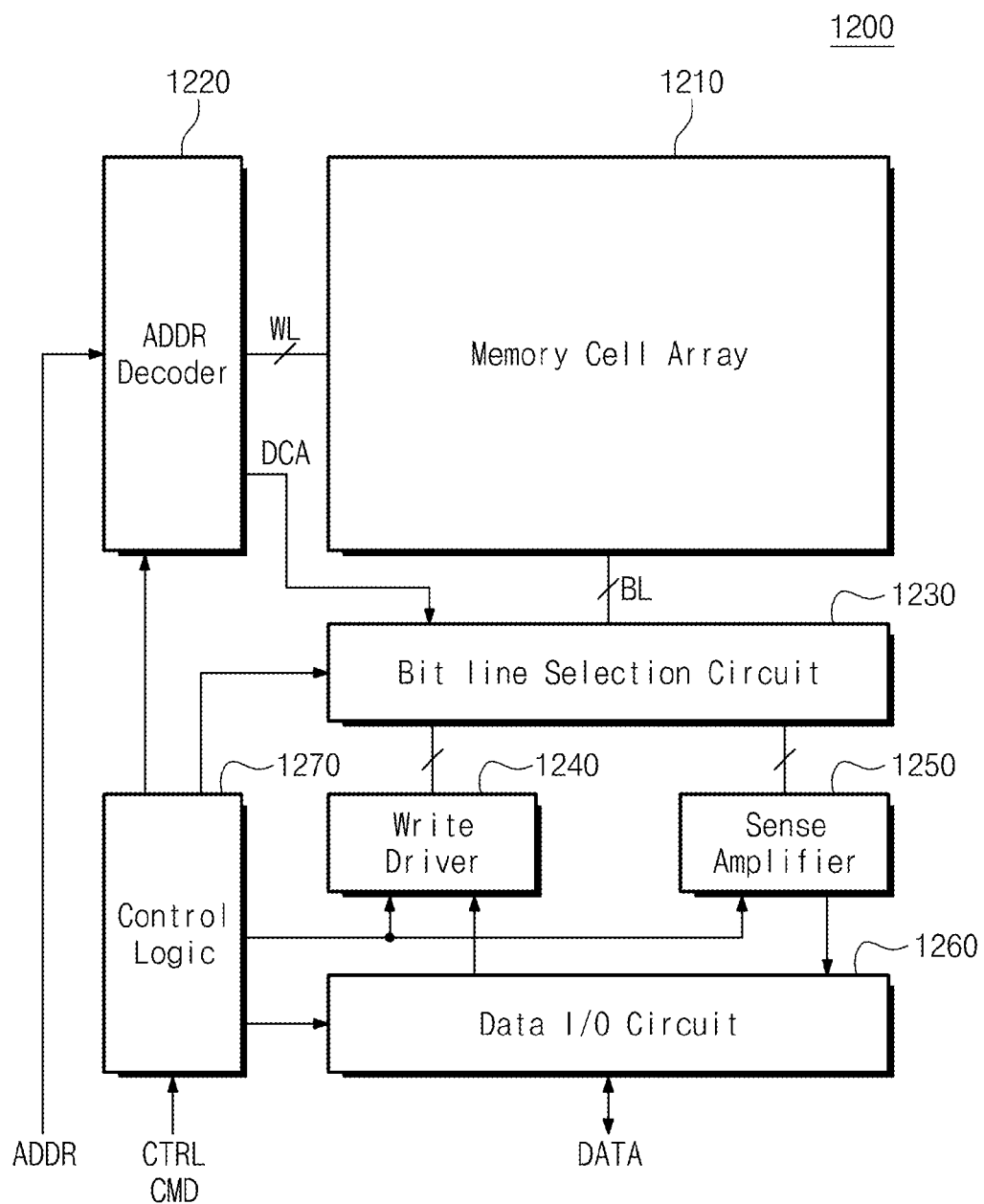
FIG. 3 is a block diagram illustrating a phase change memory according to an embodiment of the inventive concept.

FIG. 3 is a block diagram illustrating phase change memory 1200 according to an embodiment of the inventive concept.

Referring to FIG. 3, phase change memory 1200 comprises a memory cell array 1210, an address decoder 1220, a bit line selection circuit 1230, a write driver 1240, a sense amplifier 1250, a data input/output circuit 1260, and control logic 1270.

Memory cell array 1210 is connected to address decoder 1220 via word lines WL and to bit line selection circuit 1230 via bit lines BL. Memory cell array 1210 comprises a plurality of memory cells. In some embodiments, memory cells arranged in a row direction are connected to word lines WL and memory cells arranged in a column direction are connected to bit lines BL. In some embodiments, the memory cells of memory cell array 1210 store one or more bits of data, respectively.

Address decoder 1220 is connected to memory cell array 1210 via word lines WL. Address decoder 1220 is configured to operate responsive to the control of control logic 1270. Address decoder 1220 receives an address ADDR from an external device.

Address decoder 1220 is configured to decode a row address of input address ADDR. Using the decoded row address, address decoder 1220 may select word lines WL. Address decoder 1220 is configured to decode a column address of input address ADDR. Decoded column address DCA is provided to bit line selection circuit 1230. In some embodiments, address decoder 1220 comprises features such as a row decoder, a column decoder, and an address buffer.

Bit line selection circuit 1230 is connected to memory cell array 1210 through bit lines BL and to write driver 1240 and sense amplifier 1250. Bit line selection circuit 1230 operates under control of control logic 1270. Bit line selection circuit 1230 is configured to receive decoded column address DCA from address decoder 1220. Using decoded column address DCA, bit line selection circuit 1230 may select bit lines BL.

At a program operation, bit line selection circuit 1230 may connect bit lines BL to write driver 1240. At a read operation, bit line selection circuit 1230 may connect bit lines BL to sense amplifier 1250.

Write driver 1240 may operate responsive to the control of control logic 1270. Write driver 1240 is configured to program memory cells defined by bit lines selected by bit line selection circuit 1230 and a word line selected by address decoder 1220. Write driver 1240 generates a set current or a reset current according to data received from the data input/output circuit, and may output the set current or the reset current to the selected bit lines.

Sense amplifier 1250 operates under control of control logic 1270. Sense amplifier 1250 is configured to read memory cells defined by bit lines selected by bit line selection circuit 1230 and a word line selected by address decoder 1220. Sense amplifier 1250 reads the memory cells by sensing currents flowing through the selected bit lines or voltages of the selected bit lines. Sense amplifier 1250 outputs the read data to data input/output circuit 1260.

Data input/output circuit 1260 operates under the control of control logic 1270. Data input/output circuit 1260 may transfer externally received data to write driver 1240 and output data provided from sense amplifier 1250 to an external device.

Control logic 1270 controls overall operations of phase change memory 1200. Control logic 1270 operates responsive to a command CMD and a control signal CTRL received from the external device.

Phase change memory 1200 provides the random access function. A physical address system of phase change memory 1200 is equal to a logical address system of an external host. Thus, controller 1300 in FIG. 1 may not require a device for translating a logical address of the external host into a physical address of phase change memory 1200.

Figure 4:
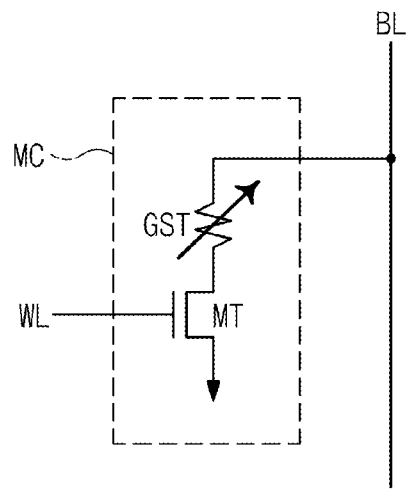
FIG. 4 is a diagram illustrating a memory cell of the phase change memory of FIG. 3.

FIG. 4 is a diagram illustrating an example of a memory cell in phase change memory 1200 of FIG. 3.

Referring to FIG. 4, a memory cell MC comprises a resistance variable element GST and a selection transistor MT. Resistance variable element GST is connected to a bit line BL. Selection transistor MT is connected between resistance variable element GST and a ground. A gate of selection transistor MT is connected to a word line WL.

Where a voltage is applied to word line WL, selection transistor MT is turned on. At this time, resistance variable element GST is supplied with a current via bit line BL.

Resistance variable element GST comprises a phase change material. The phase change material comprises a Ge—Sb—Te (GST) material whose resistance varies according to a temperature. The phase change material may be changed to have a crystal state or an amorphous state according to a temperature. The phase change material may be switched into a crystal state or an amorphous state according to a current supplied via bit line BL.

Figure 5:
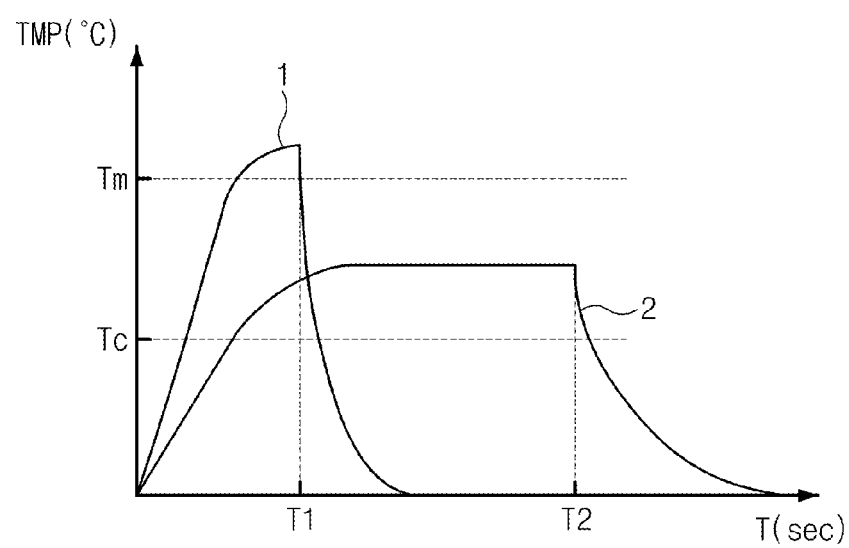
FIG. 5 is a graph illustrating characteristics of a phase change material in the memory cell of FIG. 4.

FIG. 5 is a graph illustrating temperature (TMP(° C.)) versus time (T(sec)) characteristics of a phase change material in the memory cell of FIG. 4. In FIG. 5, a reference numeral 1 indicates conditions where the phase change material is switched into an amorphous state, and a reference numeral 2 indicates conditions where the phase change material is switched into a crystal state.

Referring to FIGS. 4 and 5, the phase change material may be set to the amorphous state when it is heated at a temperature higher than a melting temperature Tm during a first time T1 and then is quickly quenched. The amorphous state may be referred to as a reset state, and it may store data of '1'.

The phase change material can be set to the crystal state when it is heated at a temperature lower than a melting temperature Tm and higher than a crystallization temperature Tc during a second time T2 longer than first time T1 and then is slowly quenched. The crystal state may be referred to as a set state, and it may store data of '0'.

Memory cell MC may have resistance varied according to an amorphous volume of a phase change material. Resistance of memory cell MC may larger than that of the amorphous state and smaller than that of the crystal state.

Figure 6:
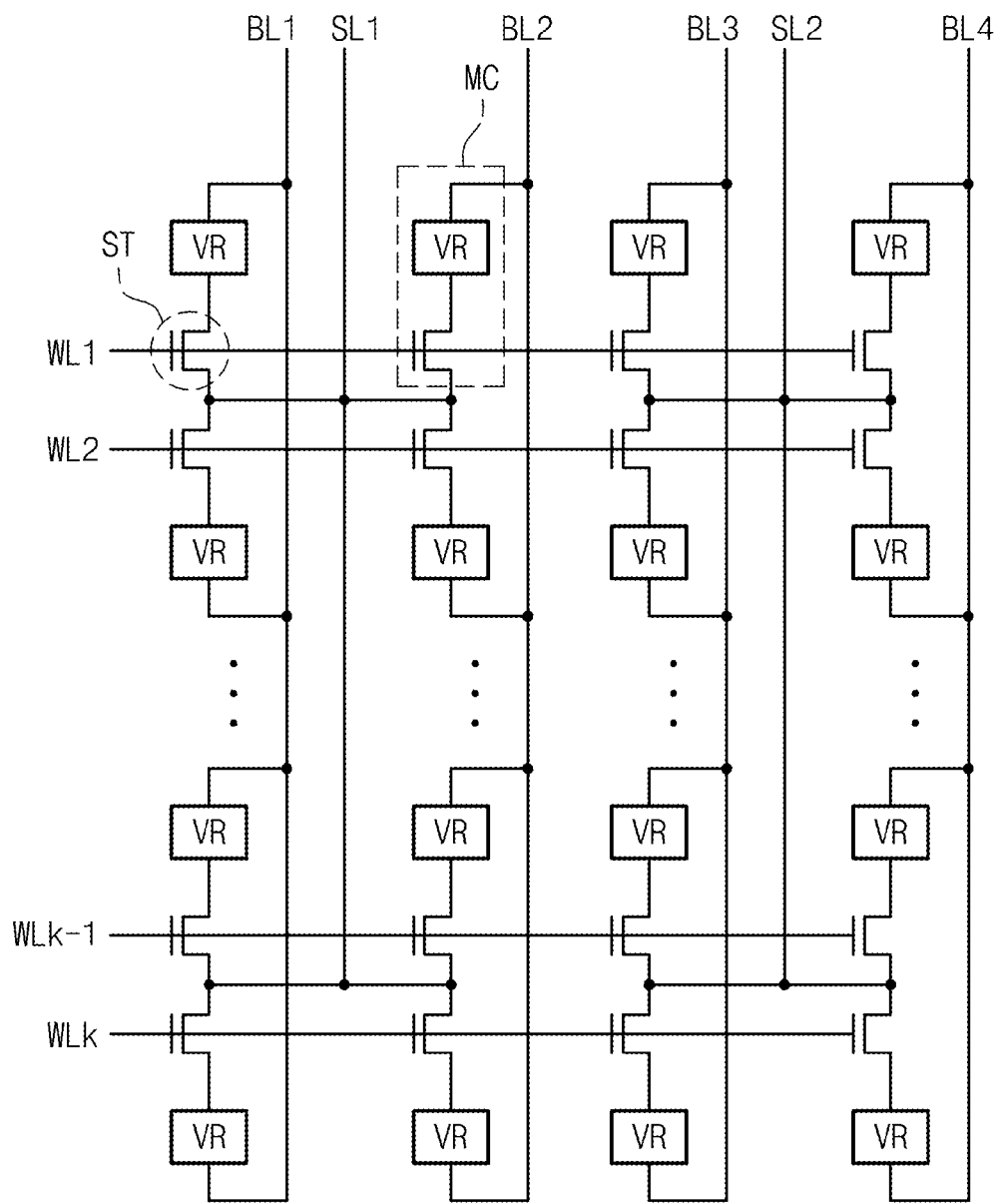
FIG. 6 is a diagram illustrating a memory cell of the phase change memory of FIG. 3 according to another embodiment of the inventive concept.

FIG. 6 is a diagram illustrating a memory cell of the phase change memory of FIG. 3 according to another embodiment of the inventive concept. More specifically, an array of such memory cells is illustrated in FIG. 6.

Referring to FIG. 6, memory cells are connected to first to fourth bit lines BL1 to BL4, first and second source lines SL1 and SL2, and word lines WL1 to WLk.

Each memory cell comprises a selection transistor ST and a resistance variable element VR. Resistance variable element VR is connected to a bit line BL and selection transistor ST. Selection transistor ST may be connected to a source line SL.

In certain embodiments, resistance variable element VR may be configured to store data using a resistance value. A resistance value of resistance variable element VR may be varied according to a signal transferred via bit line BL and source line SL, for example, a voltage or a current.

Selection transistor ST may be connected between resistance variable element VR and source line SL, and may operate in response to a corresponding word line WL. That is, selection transistor ST may be turned on or off according to a voltage level of word line WL. Selection transistors ST arranged at the same row may be connected to a common word line. Thus, memory cells MC may be selected and unselected by a word line voltage by a row unit.

Memory cells MC located in the same column are connected to a common bit line BL. For example, memory cells MC located in a first column are connected to a first bit line BL1, memory cells MC located in a second column are connected to a second bit line BL2, memory cells MC located in a third column are connected to a third bit line BL3, and memory cells MC located in a fourth column are connected to a fourth bit line BL4.

Memory cells MC connected to two bit lines may be configured to share a source line. For example, memory cells MC connected to the first and second bit lines BL1 and BL2 are configured to share a first source line SL1, and memory cells MC connected to the third and fourth bit lines BL3 and BL4 are configured to share a second source line SL2. That is, memory cells MC are connected between the first and second bit lines BL1 and BL2 and first source line SL2, and memory cells are connected between the third and fourth bit lines BL3 and BL4 and second source line SL2.

Figure 7:
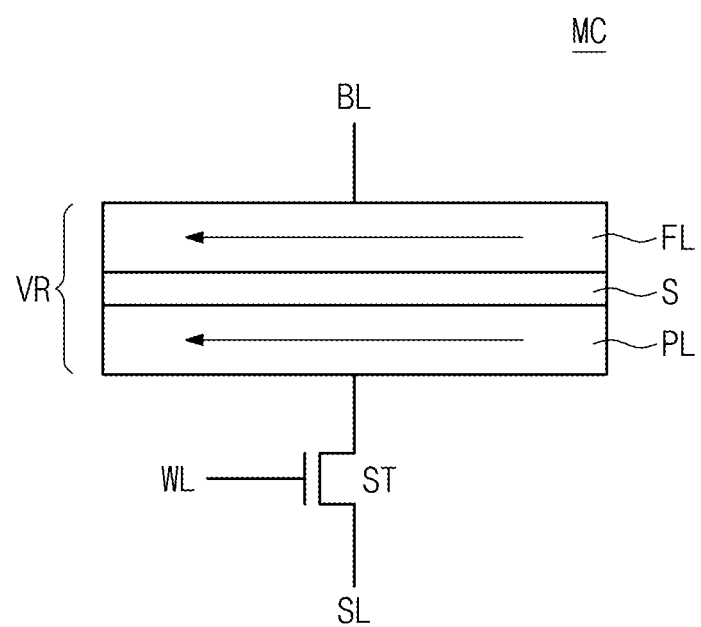
FIG. 7 is a diagram illustrating a more specific example of the memory cell shown in FIG. 6.

FIG. 7 is a diagram illustrating a more specific example of the memory cell shown in FIG. 6 according to one embodiment.

Referring to FIG. 6, a resistance variable element VR and a selection transistor ST are connected between a bit line BL and a source line SL.

Resistance variable element VR comprises a fixed magnetic layer PL, a free magnetic layer FL, and an intermediate layer S. Fixed magnetic layer PL comprises a ferroelectric material. Fixed magnetic layer PL may have a fixed magnetization direction. A magnetization direction of fixed magnetic layer PL is depicted by an arrow.

Free magnetic layer FL comprises a ferroelectric material. Free magnetic layer FL has a magnetization direction which is varied according to a bias condition. A magnetization direction of free magnetic layer FL is depicted by an arrow.

Intermediate layer S operates as a tunnel barrier. For example, intermediate layer S may be formed of crystallized oxide magnesium.

Where magnetization directions of fixed magnetic layer PL and free magnetic layer FL coincides, resistance variable element VR may have a low resistance state. When magnetization directions of fixed magnetic layer PL and free magnetic layer FL are different, resistance variable element VR may have a high resistance state.

In some embodiments, resistance variable element VR may be a spin torque transfer magnetic resistance element. Where a write current flows to a source line SL from a bit line BL, resistance variable element VR may be written to have a low resistance state. Where a write current flows to a bit line BL from a source line SL, resistance variable element VR may be written to have a high resistance state.

Figure 8:
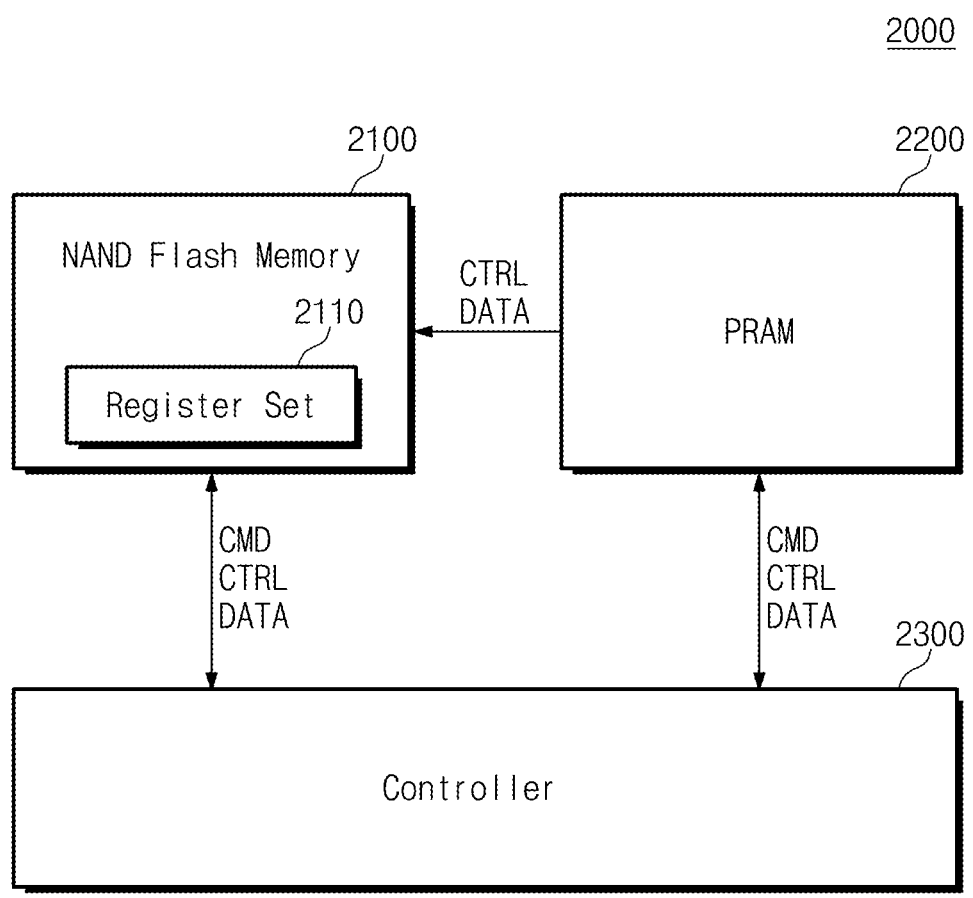
FIG. 8 is a block diagram illustrating a memory system according to another embodiment of the inventive concept.

FIG. 8 is a block diagram illustrating a memory system 2000 according to another embodiment of the inventive concept.

Referring to FIG. 8, memory system 2000 comprises a NAND flash memory 2100 comprising a register set 2110, a phase change memory 2200, and a controller 2300. These features are configured similar to respective a NAND flash memory 1100, phase change memory 1200, and controller 1300 of memory system 1000.

Compared with memory system 1000 of FIG. 1, phase change memory 2200 outputs a control signal CTRL and data to NAND flash memory 2100. For example, phase change memory 2200 may provide NAND flash memory 2100 with operation information as data. Phase change memory 2200 outputs a control signal CTRL (e.g., a data strobe signal DQS) as a signal used to provide data to NAND flash memory 2100.

Figure 9:
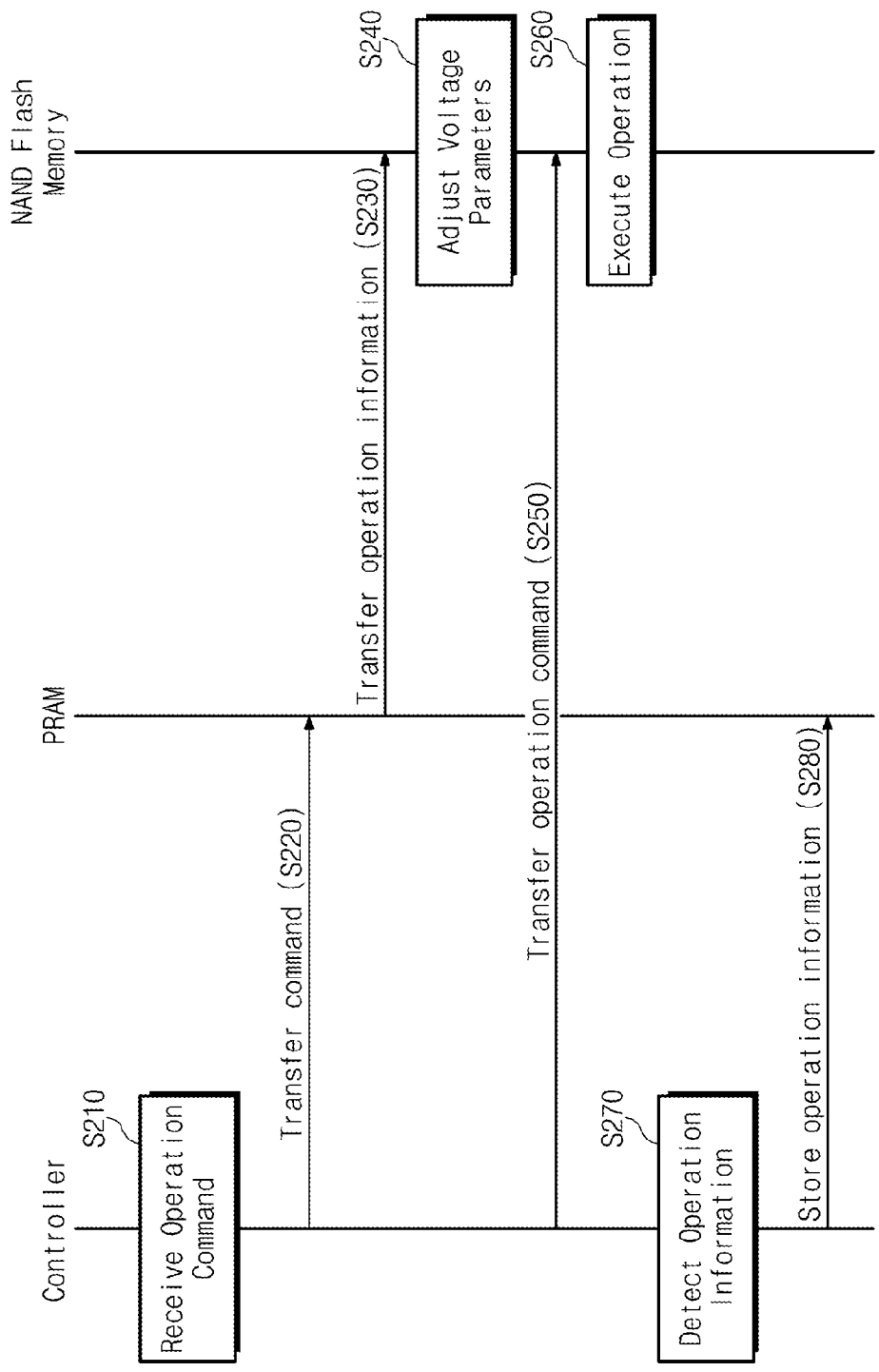
FIG. 9 is a flowchart illustrating a method of operating a memory system according to another embodiment of the inventive concept.

FIG. 9 is a flowchart illustrating a method of operating a memory system according to another embodiment of the inventive concept. For convenience, it will be assumed that the method of FIG. 9 is performed by memory system 2000 of FIG. 8.

Referring to FIGS. 8 and 9, in operation S210, controller 2300 receives an operation command. Controller 2300 receives a program, read, or erase command from an external host, or may generate and receive a program, read, or erase command according to a schedule.

In operation S220, controller 2300 sends a command to a phase change memory 2200. Thereafter, in operation S230, phase change memory 2200 outputs operation information to a NAND flash memory 2100 in response to a command received from controller 2300.

Then, in operation S240, NAND flash memory 2100 adjusts voltage parameters based on the operation information received from phase change memory 2200.

In operation S250, controller 2300 outputs an operation command to NAND flash memory 2100. Controller 2300 outputs a program, read, or erase command after adjustment of voltage parameters of NAND flash memory 2100 is completed. Controller 2300 judges whether adjustment of voltage parameters of NAND flash memory 2100 is completed, based on a ready/busy signal of NAND flash memory 2100 or by performing a status read operation of NAND flash memory 2100.

In operation S260, NAND flash memory 2100 performs a program, read, or erase operation. In operation S270, controller 2300 detects changed operation information. In operation S280, controller 2300 stores the changed operation information in phase change memory 2200.

For example, a program and erase cycle PE may be changed where a program operation of NAND flash memory 2100 is performed. Also, a temperature at programming and a program time may be established. A read number NR may be changed where a read operation of NAND flash memory 2100 is carried out. The program and erase cycle PE may be changed where an erase operation of NAND flash memory 2100 is performed.

Figure 10:
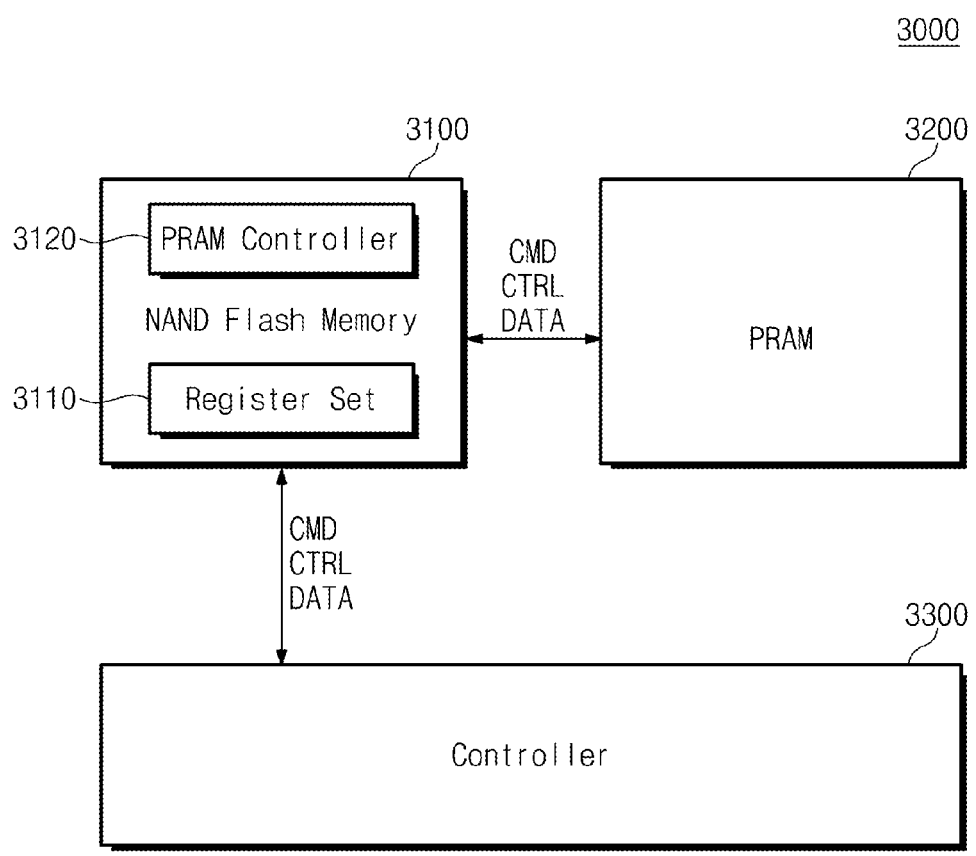
FIG. 10 is a block diagram illustrating a memory system according to still another embodiment of the inventive concept.

FIG. 10 is a block diagram illustrating a memory system 3000 according to still another embodiment of the inventive concept.

Referring to FIG. 10, memory system 3000 comprises a NAND flash memory 3100 comprising a register set 3110 and a PRAM controller 3120, a phase change memory 3200, and a controller 3300. These features are configured similar to respective a NAND flash memory 1100, phase change memory 1200, and controller 1300 of memory system 1000.

Compared with a memory system 1000 in FIG. 1, phase change memory 3200 does not communicate with controller 3300. NAND flash memory 3100 further comprises a phase change memory 3120. Phase change memory 3120 operates under the control of a phase change memory controller 3120. That is, phase change memory 3200 may receive a control signal CTRL and a command CMD from NAND flash memory 3100, and may exchange data with NAND flash memory 3100.

Figure 11:
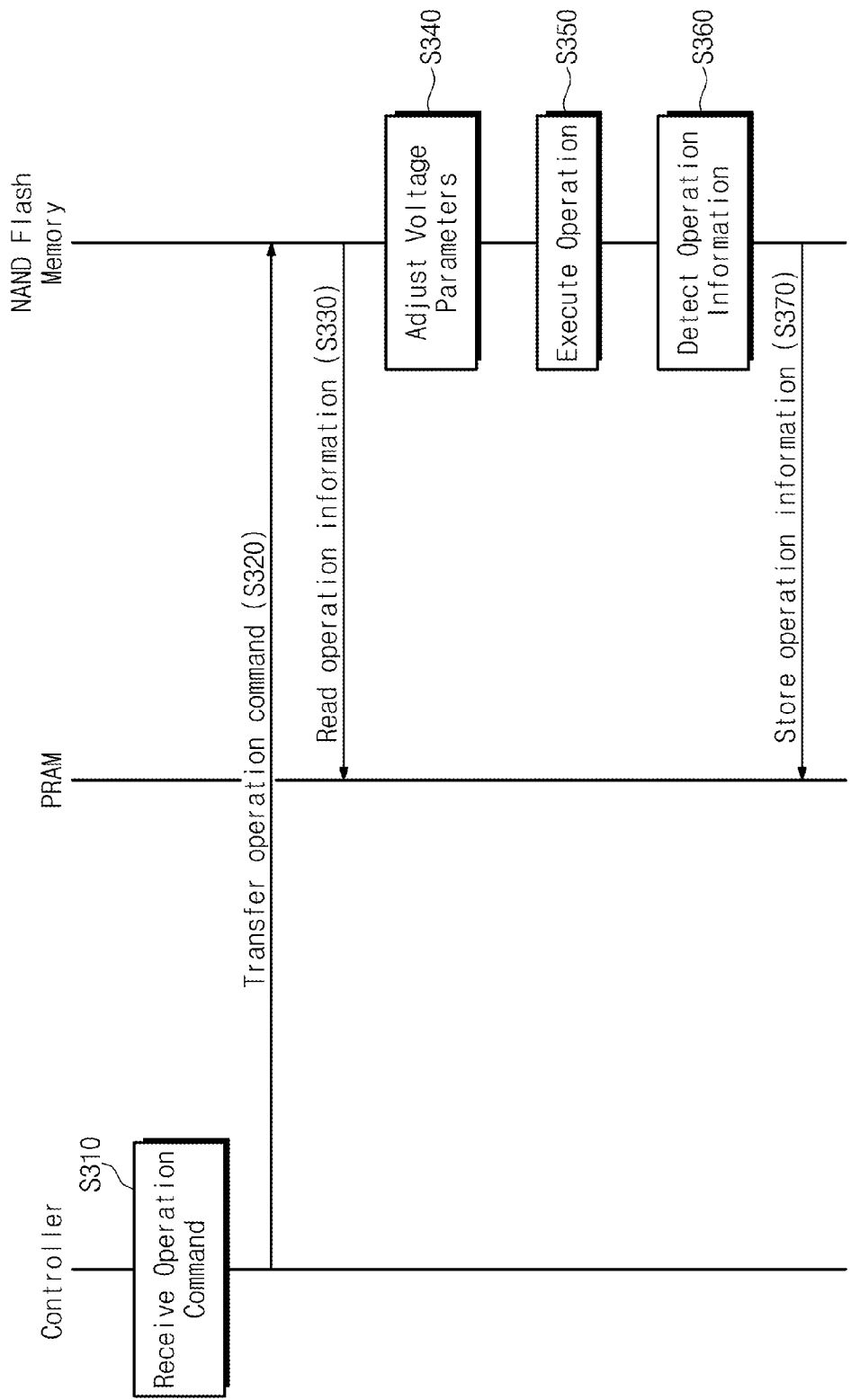
FIG. 11 is a flowchart illustrating a method of operating a memory system according to still another embodiment of the inventive concept.

FIG. 11 is a flowchart illustrating a method of operating a memory system according to still another embodiment of the inventive concept. For convenience, it will be assumed that the method of FIG. 11 is performed by memory system 3000 of FIG. 10.

Referring to FIGS. 10 and 11, in operation S310, controller 3300 receives an operation command. Controller 3300 receives a program, read, or erase command from an external host, or it generates and receives a program, read, or erase command according to a schedule.

In operation S320, controller 3300 outputs an operation command to NAND flash memory 3100. Controller 3300 may output a program, read, or erase command to NAND flash memory 3100.

In operation S330, NAND flash memory 3100 may read operation information stored in phase change memory 3200. NAND flash memory 3100 may read the operation information from phase change memory 3200 using a phase change memory controller 3120.

In operation S340, NAND flash memory 3100 may adjust voltage parameters based on the read operation information. In operation S350, NAND flash memory 3100 may perform an operation corresponding to the operation command received from controller 3300. NAND flash memory 3100 may perform a program, read, or erase operation.

In operation S360, NAND flash memory 3100 may detect a change of the operation information. In operation S370, NAND flash memory 3100 may store the detected operation information at phase change memory 3200.

Figure 12:
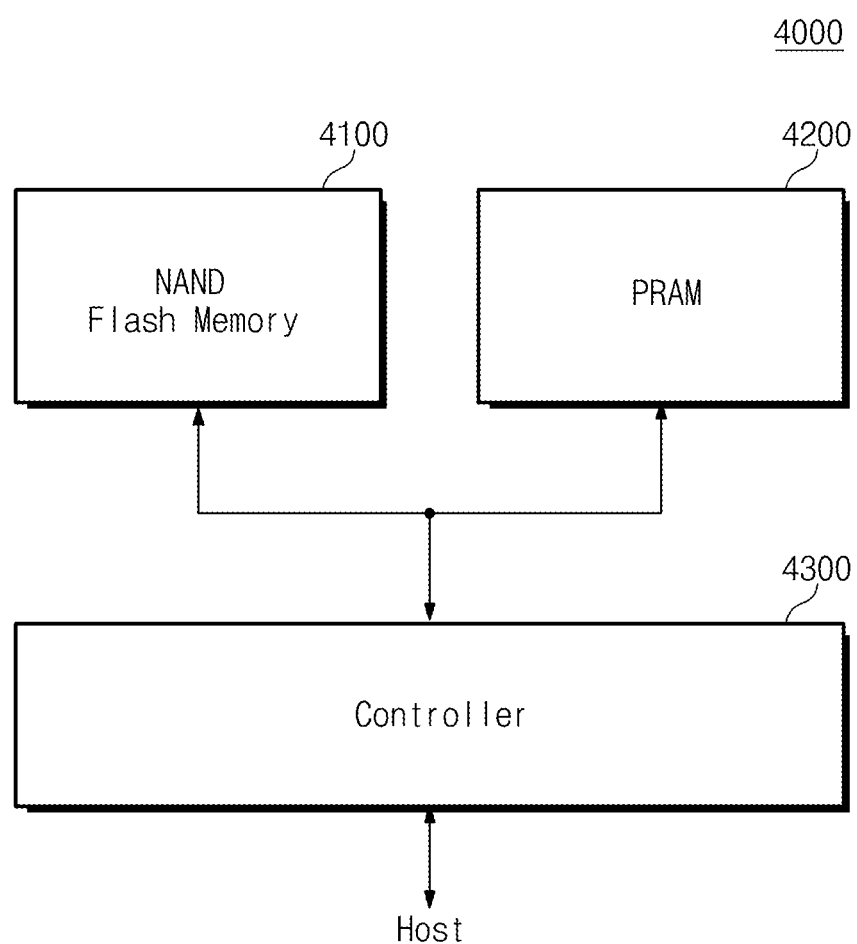
FIG. 12 is a block diagram illustrating a memory system according to still another embodiment of the inventive concept.

FIG. 12 is a block diagram illustrating a memory system 4000 according to still another embodiment of the inventive concept.

Referring to FIG. 12, memory system 4000 comprises a NAND flash memory 4100, phase change memory 4200, and a controller 4300. These features are configured similar to respective a NAND flash memory 1100, phase change memory 1200, and controller 1300 of memory system 1000.

Compared with memory system 1000 in FIG. 1, controller 4300 controls NAND flash memory 4100 and phase change memory 4200 via a common bus. NAND flash memory 4100 and phase change memory 4200 communicate with controller 4300 in a time division manner. Operation information stored in phase change memory 4200 is directly transferred to NAND flash memory 4100 without passing through controller 4300.

Figure 13:
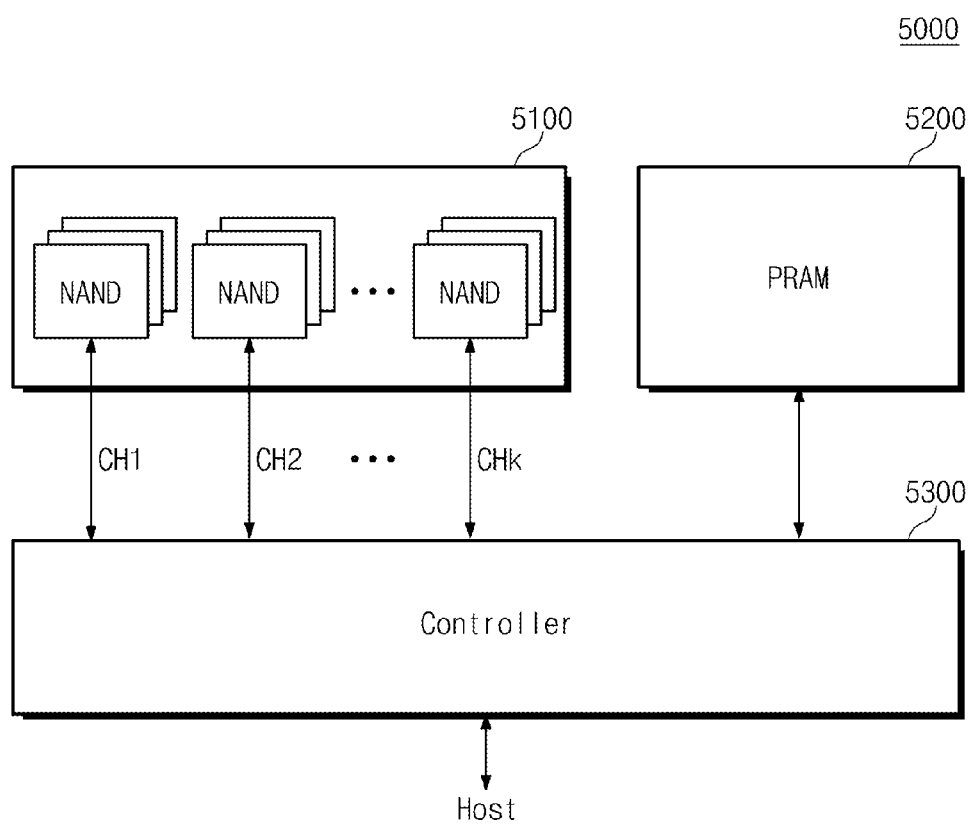
FIG. 13 is a block diagram illustrating a memory system according to still another embodiment of the inventive concept.

FIG. 13 is a block diagram illustrating a memory system 5000 according to still another embodiment of the inventive concept.

Referring to FIG. 13, memory system 5000 comprises a NAND flash memory 5100, a phase change memory 5200, and a controller 5300. These features are configured similar to respective a NAND flash memory 1100, phase change memory 1200, and controller 1300 of memory system 1000.

Compared with a memory system 1000 in FIG. 1, NAND flash memory 5100 communicates with controller 5300 via a plurality of channels CH1 to CHk. Each channel may be connected with a plurality of NAND flash memory chips.

In some embodiments, as described with reference to FIG. 12, NAND flash memory 5100 and controller 5300 may be connected via a common bus, and channels CH1 to CHk may occupy the common bus in a time division manner.

In some embodiments, as described with reference to FIG. 12, NAND flash memory 5100 and phase change memory 5200 may be connected with controller 5300 via a common bus, and may communicate with controller 5300 in a time division manner.

Figure 14:
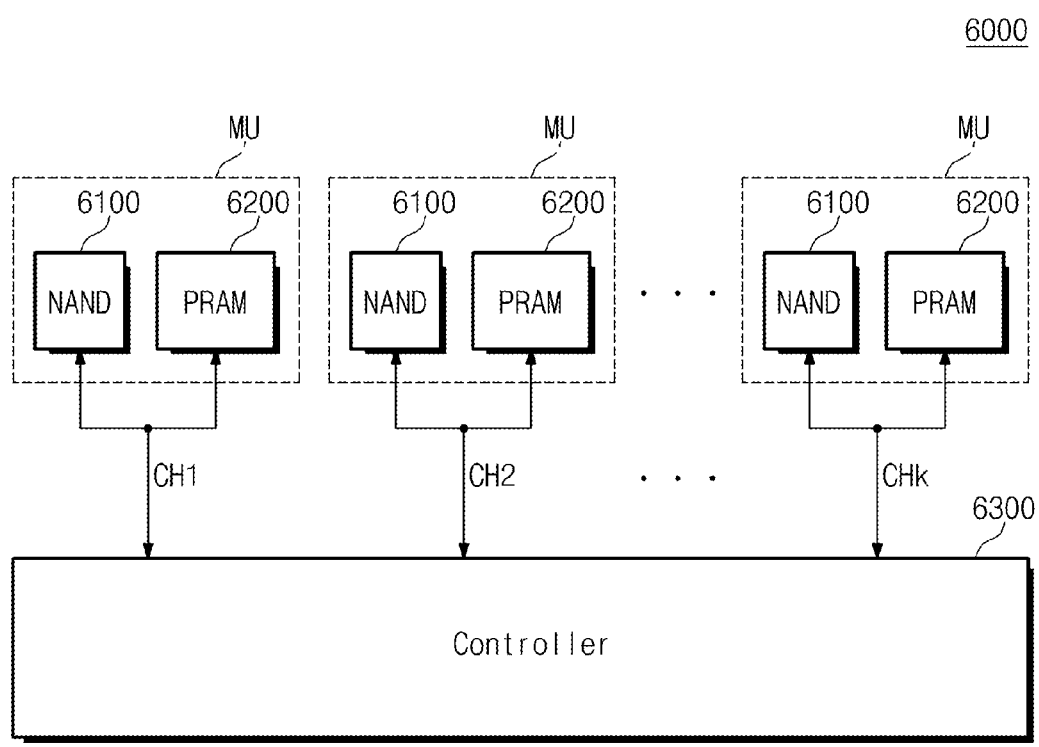
FIG. 14 is a block diagram illustrating a memory system according to still another embodiment of the inventive concept.

FIG. 14 is a block diagram illustrating a memory system 6000 according to still another embodiment of the inventive concept.

Referring to FIG. 14, memory system 6000 comprises a plurality of memory units MU and a controller 6300. Memory units MU communicate with controller 6300 via a plurality of channels CH1 to CHk.

Each of memory units MU comprises at least one NAND flash memory 6100 and a phase change memory 6200. In each memory unit MU, at least one NAND flash memory 6100 and a phase change memory 6200 may communicate with controller 6300 via a common channel. In each memory unit MU, at least one NAND flash memory 6100 and a phase change memory 6200 may occupy a common channel in a time division manner.

Figure 15:
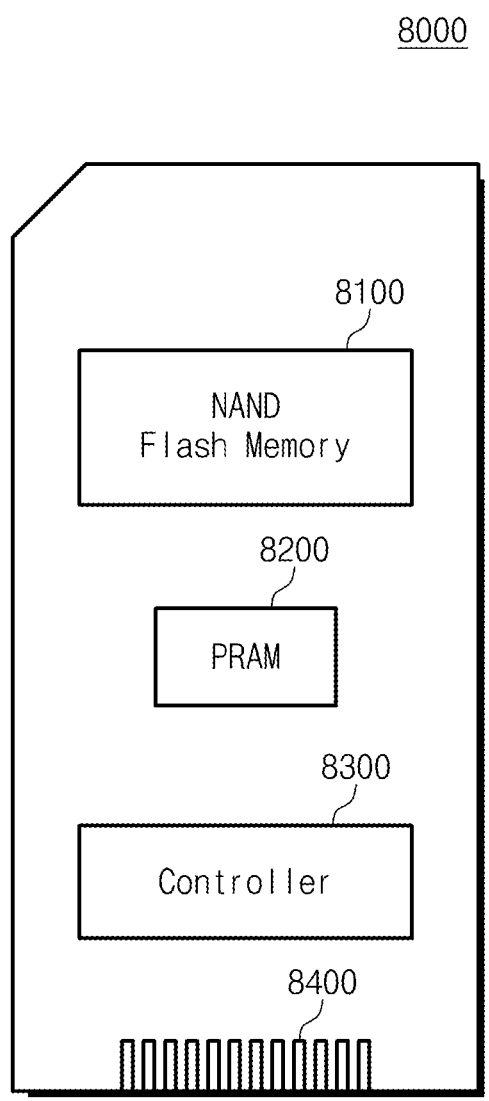
FIG. 15 is a diagram illustrating a memory card according to an embodiment of the inventive concept.

FIG. 15 is a diagram illustrating a memory card 8000 according to an embodiment of the inventive concept.

Referring to FIG. 15, memory card 8000 comprises a NAND flash memory 8100, a phase change memory 8200, a controller 8300, and a connector 8400. NAND flash memory 8100 operates using operation information stored in phase change memory 8200.

Memory card 8000 can take any of several alternative forms, such as a PC (PCMCIA) card, a CF card, an SM (or, SMC) card, a memory stick, a multimedia card (MMC, RS-MMC, MMCmicro), a security card (SD, miniSD, microSD, SDHC), or a universal flash storage (UFS) device.

Figure 16:
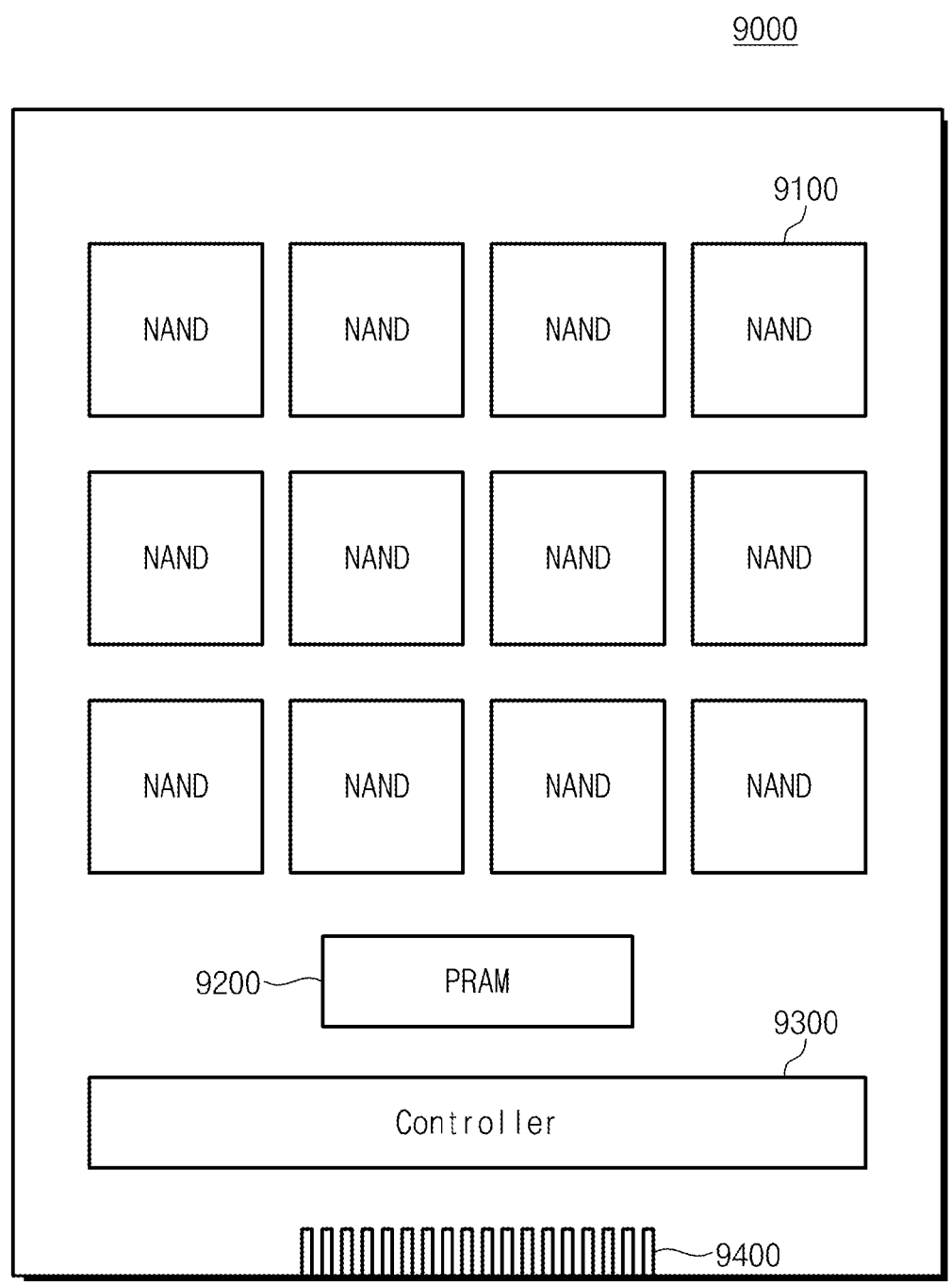
FIG. 16 is a diagram illustrating a solid state drive according to an embodiment of the inventive concept.

FIG. 16 is a diagram illustrating a solid state drive 9000 according to an embodiment of the inventive concept.

Referring to FIG. 16, solid state drive 9000 comprises multiple units of a NAND flash memory 9100, a phase change memory 9200, a controller 9300, and a connector 9400.

NAND flash memory 9100 operates using operation information stored in phase change memory 9200.

Figure 17:
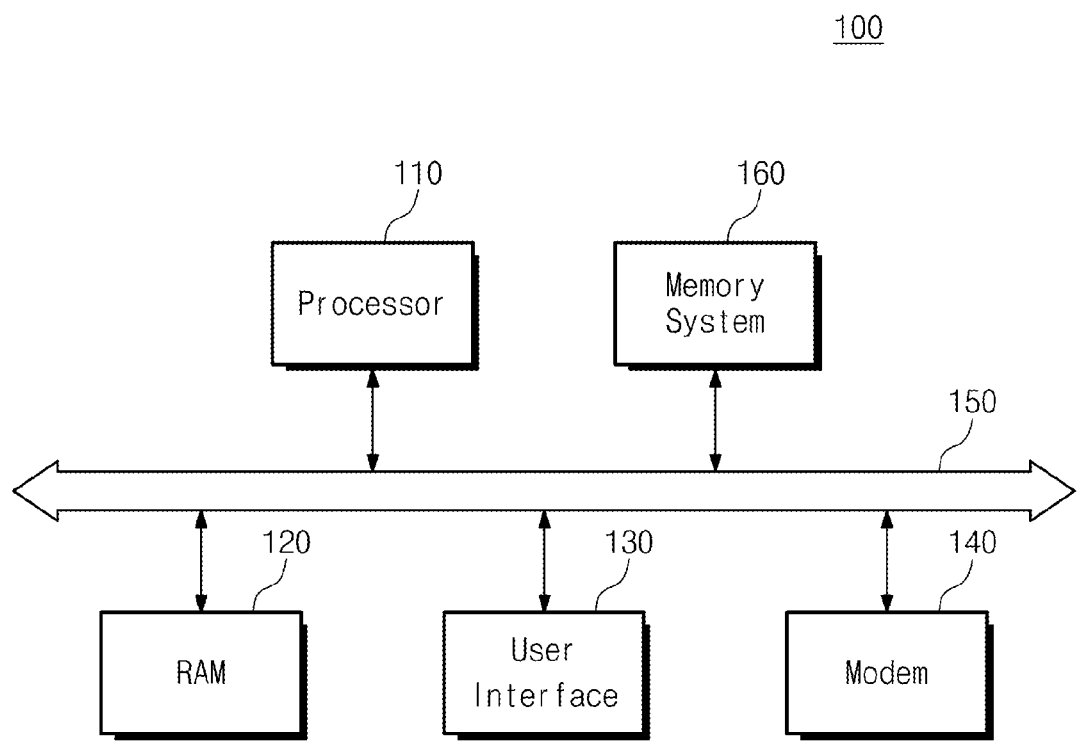
FIG. 17 is a block diagram illustrating a computing system according to an embodiment of the inventive concept.

FIG. 17 is a block diagram illustrating a computing system 100 according to an embodiment of the inventive concept.

Referring to FIG. 17, computing system 100 comprises a central processing unit 110, a RAM 120, a user interface 130, a modem 140, a system bus 150, and a memory system 160.

Memory system 160 is connected electrically with elements 110 to 140 via system bus 150. Data provided via user interface 130 or processed by central processing unit 110 may be stored in memory system 160. Memory system 160 may be one of memory systems 1000 to 7000 described with reference to FIGS. 1, 8, 10, and 12 to 14, for instance.

In the above description, embodiments of the inventive concept are described in relation to memory systems each comprising a phase change memory and a NAND flash memory. However, the inventive concept is not limited thereto. For example, the inventive concept may be applied to a memory system including one of a NAND flash memory and variable resistance memories such as MRAM, FeRAM, ReRAM, and the like. The resistance-variable memory may comply with a NAND sequence.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A memory system, comprising:
   a nonvolatile memory;
   a phase change memory configured to store operation information of the nonvolatile memory; and
   a controller configured to adjust voltage parameters using the operation information stored in the phase change memory and to control the nonvolatile memory to perform a program, read, or erase operation according to the adjusted voltage parameters.

2. The memory system of claim 1, wherein the controller is further configured to read the operation information stored in the phase change memory, to output control signals used to adjust the voltage parameters to the nonvolatile memory based on the read operation information, and to output a program, read, or erase command to the nonvolatile memory.

3. The memory system of claim 1, wherein the controller is further configured to output a command to the phase change memory, the phase change memory is configured to output the operation information to the nonvolatile memory in response to the command, and the nonvolatile memory is configured to adjust the voltage parameters using the operation information, the controller outputting the program, read, or erase command to the nonvolatile memory in which the voltage parameters are adjusted.

4. The memory system of claim 1, wherein the controller outputs a program, read, or erase command to the nonvolatile memory, the nonvolatile memory reads the operation information stored in the phase change memory in response to the program, read, or erase command, and the nonvolatile memory adjusts the voltage parameters using the operation information, the nonvolatile memory performing the program, read or erase operation using the adjusted voltage parameters.

5. The memory system of claim 1, wherein the nonvolatile memory comprises a plurality of cell strings each comprising a plurality of memory cells connected in series.

6. The memory system of claim 1, wherein the memory system is a memory card or a solid state drive.

7. A memory system, comprising:
   a controller configured to read operation information for a nonvolatile memory from a phase change memory, to adjust voltage parameters of the nonvolatile memory based on the read operation information, and control an operation of the nonvolatile memory based on the adjusted voltage parameters.

8. The memory system of claim 7, wherein the voltage parameters comprise application times of voltages used for the operation of the nonvolatile memory.

9. The memory system of claim 7, wherein the voltage parameters comprise the number of read operations executed after specific memory cells of the nonvolatile memory are programmed.

10. The memory system of claim 7, wherein the operation information comprises a time when programming of specific memory cells of the nonvolatile memory is executed.

11. The memory system of claim 7, wherein the operation information comprises the number of program or erase operations of specific memory cells of the nonvolatile memory.

12. A method of operating a memory system comprising a nonvolatile memory and a phase change memory, the method comprising:
reading operation information of the nonvolatile memory from the phase change memory;
adjusting voltage parameters of the nonvolatile memory based on the read operation information; and
performing an operation of the nonvolatile memory based on the adjusted voltage parameters.

13. The method of claim 12, wherein the voltage parameters comprise levels of voltages used for the operation of the nonvolatile memory.

14. The method of claim 12, wherein the voltage parameters comprise application times of voltages used for the operation of the nonvolatile memory.

15. The method of claim 12, wherein the voltage parameters comprise the number of read operations executed after specific memory cells of the nonvolatile memory are programmed.

16. The method of claim 12, wherein the operation information comprises a time when programming of specific memory cells of the nonvolatile memory is executed.

17. The method of claim 12, wherein the operation information comprises the number of program or erase operations of specific memory cells of the nonvolatile memory.

18. The method of claim 12, wherein the operation information comprises a temperature when specific memory cells of the nonvolatile memory are programmed.

19. The method of claim 12, wherein the operation information comprises a difference between a reference temperature and a temperature when specific memory cells of the nonvolatile memory are programmed.

20. The method of claim 12, wherein the operation comprises a program operation, a read operation, or an erase operation.

* * * * *